(12) United States Patent
Redouté et al.

(10) Patent No.: US 8,487,663 B2
(45) Date of Patent: Jul. 16, 2013

(54) DRIVER CIRCUIT WITH EMI IMMUNITY

(75) Inventors: Jean-Michel Vladimir Redouté, Heverlee (BE); Michiel Steyaert, Leuven (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1237 days.

(21) Appl. No.: 11/835,187

(22) Filed: Aug. 7, 2007

(65) Prior Publication Data
US 2008/0042696 A1 Feb. 21, 2008
US 2009/0115462 A9 May 7, 2009

(30) Foreign Application Priority Data

Aug. 8, 2006 (EP) .................................. 06016488

(51) Int. Cl.
*H03K 5/12* (2006.01)
(52) U.S. Cl.
USPC .......................................... 327/108; 327/170
(58) Field of Classification Search
None
See application file for complete search history.

(56) References Cited

U.S. PATENT DOCUMENTS

| | | | |
|---|---|---|---|
| 4,567,378 A | 1/1986 | Raver | |
| 5,598,119 A | 1/1997 | Thayer | |
| 5,742,193 A * | 4/1998 | Colli et al. | 327/170 |
| 5,828,245 A * | 10/1998 | Brambilla et al. | 327/108 |
| 5,939,909 A * | 8/1999 | Callahan, Jr. | 327/108 |
| 6,194,935 B1 | 2/2001 | Pioppo | |
| 6,271,699 B1 * | 8/2001 | Dowlatabadi | 327/170 |
| 6,700,422 B2 * | 3/2004 | Tang et al. | 327/170 |
| 6,784,708 B1 | 8/2004 | Krenzke | |
| 6,784,734 B2 * | 8/2004 | Amourah | 330/253 |
| 6,842,058 B2 * | 1/2005 | McNitt et al. | 327/170 |
| 7,019,583 B2 * | 3/2006 | Del Signore et al. | 327/538 |
| 7,030,670 B2 * | 4/2006 | Lin | 327/170 |
| 7,061,225 B2 * | 6/2006 | Yang et al. | 324/103 P |
| 2002/0060592 A1 | 5/2002 | Shimoda | |
| 2002/0084825 A1 * | 7/2002 | Hwang et al. | 327/328 |
| 2006/0145734 A1 * | 7/2006 | Abdel-Hamid et al. | 327/112 |
| 2007/0008036 A1 * | 1/2007 | Chen et al. | 330/260 |

* cited by examiner

*Primary Examiner* — Tuan T Lam
(74) *Attorney, Agent, or Firm* — Workman Nydegger

(57) ABSTRACT

A driver circuit suitable for outputting a signal onto an output line affected by conducted EMI, has a slope control circuit and an output circuit, (op-amp, Mo, M13 to M21). It can be used for driving a LIN network. The slope control circuit outputs a slope controlled version of the input signal to the output circuit, which (M6,M7) is arranged to reduce an amount of conducted EMI induced DC shift in the output circuit. This can involve clipping a feedback signal, and regulating an output stage of the op-amp to prevent the DC shift. Having a separate output circuit can help shield the slope control circuit from the EMI on the output line.

8 Claims, 4 Drawing Sheets

(a)

(b)

DRIVER CIRCUIT WITH EMI IMMUNITY

CROSS-REFERENCE TO RELATED APPLICATIONS

This patent application claims the benefit of European Patent Application Serial No. 06016488.6, filed Aug. 8, 2006, which patent application is incorporated herein by reference in its entirety.

DESCRIPTION

1. Field of the Invention

This invention relates to driver circuits, to devices and systems and networks having such driver circuits and to methods of using such circuits.

2. Description of the Related Art

Line driver circuits are used for driving many different types of busses or networks. An example of such a network is LIN ("Local Interconnect Network"), which is a single-wire, serial communications protocol that is low cost, low speed (maximum transmission speed=20 kbit/s) and primarily intended to be used for distributed electronic systems in automotive applications. For more details, reference can be made to the LIN Consortium, LIN specification package revision 2.0, (http://www.lin-subbus.org,) September 2003. Owing to the very stringent EMC (electromagnetic compatibility) requirements concerning automotive electronics, the main concept behind the LIN definitions of the physical layer is that it should be able to withstand strong levels of electromagnetic noise, without in turn generating excessive electromagnetic emission which could disturb neighbouring circuits. All this makes LIN a valuable communication system, not only in automotive applications, but eventually also in home appliances. See for example D. Van Zoest and D. Otten, "Implementation of a Simulated Washing Machine With an Integrated Control Panel and Intra-Appliance Local Interconnect Network Bus," IATC, 53rd Annual Conference, 2002.

A LIN network is designed to comprise one master node and up to 15 slave nodes (the total number of nodes should not exceed 16 for correct operation). In order to comply with the severe electromagnetic emission standards, requirements have been set on the slope of the output signal of a LIN driver: indeed, the steeper the slope is, the more I-IF components are generated in the signal spectrum. The LIN specification therefore states that "the signal shape should be carefully selected in order to reduce emissions on one hand and allow for bit rates up to 20 kbit/sec on the other": for this reason, the slope of the LIN driver output signal must be controlled and set to a convenient value, which emission measurements have shown to lie around 5 us. This operation is commonly called slew rate control or slope control. This slope time must furthermore be independent of the battery voltage (which according to the LIN specification may vary between 8V and 18V) and of the load (as stated previously the total number of nodes may vary, and so the correct load is not a priori known). In order to allow a correct data transmission, the duty cycle of the signal on the LIN BUS must not be corrupted by EMI (electromagnetic interference): a summary of allowed deviations of the duty cycle and between which signal levels this value should be measured is included in the above mentioned LIN specification. Moreover, the LIN driver is defined to have an open drain output, with an internal pull up resistance of 30 kg: an external pull up resistor of 1 kΩ is further added in the master node.

A Classic LIN Driver

A LIN driver with slope control can be realized in its rudimentary form as shown in FIG. 1(a), which is from K. Appeltans, "LIN transceivers, a case study of automotive design," ISSCC, ATAC design forum, February 2005. This shows two constant current sources $I_B$ in series with switches to couple either of them to a capacitor $C_1$. The switches are intermediately switched on and off, thereby creating a linearly varying voltage across the capacitor. The capacitor is coupled across the gate and drain of an output transistor Mo and so Mo provides a controlled (and linear) slope signal which is fed through diode D2 to an output of the device, in this case an output pin of an IC. The characteristics of the rest of the line (comprising the total pull up resistance and the total capacitance between the line and ground) coupled to other devices from the output pin, are represented by $C_b$ and $R_b$, coupled to ground and to $V_{bat}$, respectively.

Mathematically the circuit operation can be expressed as follows:

$$C_f \frac{d(V_{cap}(t))}{dt} = I_B \Rightarrow V_{cap}(t) = \frac{I_B}{C_f}(t - t_0)$$

Assuming that Cf<<Cb, the voltage gain of this stage can be expressed as follows:

$$A_V = \frac{V_0(t)}{V_i(t)} = -gm.(R_p // C_b)$$

The voltage across the capacitor can then be written as:

$$V_{cap}(t) = V_o(t) - V_i(t) = \left(\frac{1 + |A_v|}{|A_v|}\right)V_o(t) \Rightarrow V_o(t) = \left(\frac{|A_v|}{1 + |A_v|}\right)V_{cap}(t)$$

So as long as the voltage gain is large, the voltage across the capacitor is equal to the output voltage, and consequently independent of the load. In a practical implementation, the current sources IB can easily be adjusted to scale according to the battery voltage, ensuring by doing so, a constant slope time that is independent of the battery voltage. The diodes D1 and D2 prevent conducted EMI from the line from coupling into the supply and the ground (during respectively a positive and a negative swing).

SUMMARY OF THE INVENTION

An object of the invention is to provide alternative or improved driver circuits, devices and systems and networks having such driver circuits and methods of using such circuits. According to a first aspect, the invention provides:

A driver circuit suitable for outputting a signal onto an output line affected by conducted EMI, the driver circuit having a slope control circuit and an output circuit, the slope control circuit being arranged to receive an input signal and output a slope controlled version of the input signal to the output circuit, the output circuit having circuitry arranged to reduce an effect of the conducted EMI on the slope (and consequently on the duty cycle) of the output of the output circuit.

Having a separate output circuit can help shield the slope control circuit from the EMI on the output line, and makes it easier to arrange the output circuit to have more immunity to the EMI, and in particular to EMI induced DC shift.

Another aspect provides a LIN driver circuit for driving a line having conducted EMI, the LIN driver circuit having a slope control circuit and an output circuit, the slope control circuit being arranged to receive an input signal and output a slope controlled version of the input signal to the output circuit, the output circuit having an amplifier with one or more feedback paths. This can provide advantages with or without additional circuitry arranged to give more immunity from conducted EMI.

Other aspects of the invention include corresponding methods of manufacturing such a driver circuit, methods of using the driver circuit, and devices or systems or networks incorporating the driver circuit.

Many optional additional features are described below. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DESCRIPTION OF THE PREFERRED EMBODIMENTS

Figure 1:
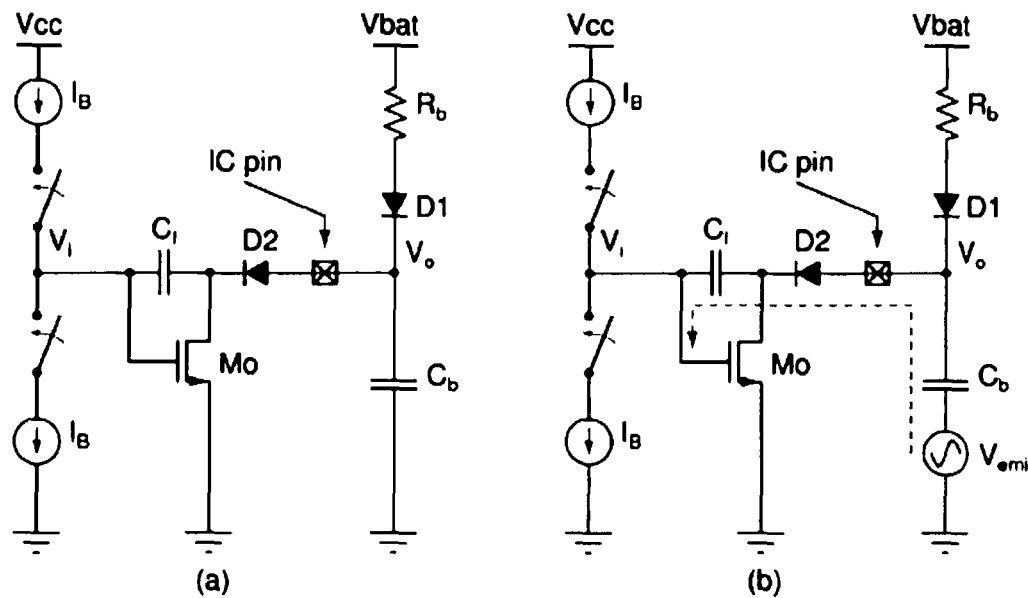
FIG. 1(a) shows a basic schematic of a classic LIN driver circuit for reference.
FIG. 1(b) shows the same circuit with an indication of the conducted EMI.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Figure 2:
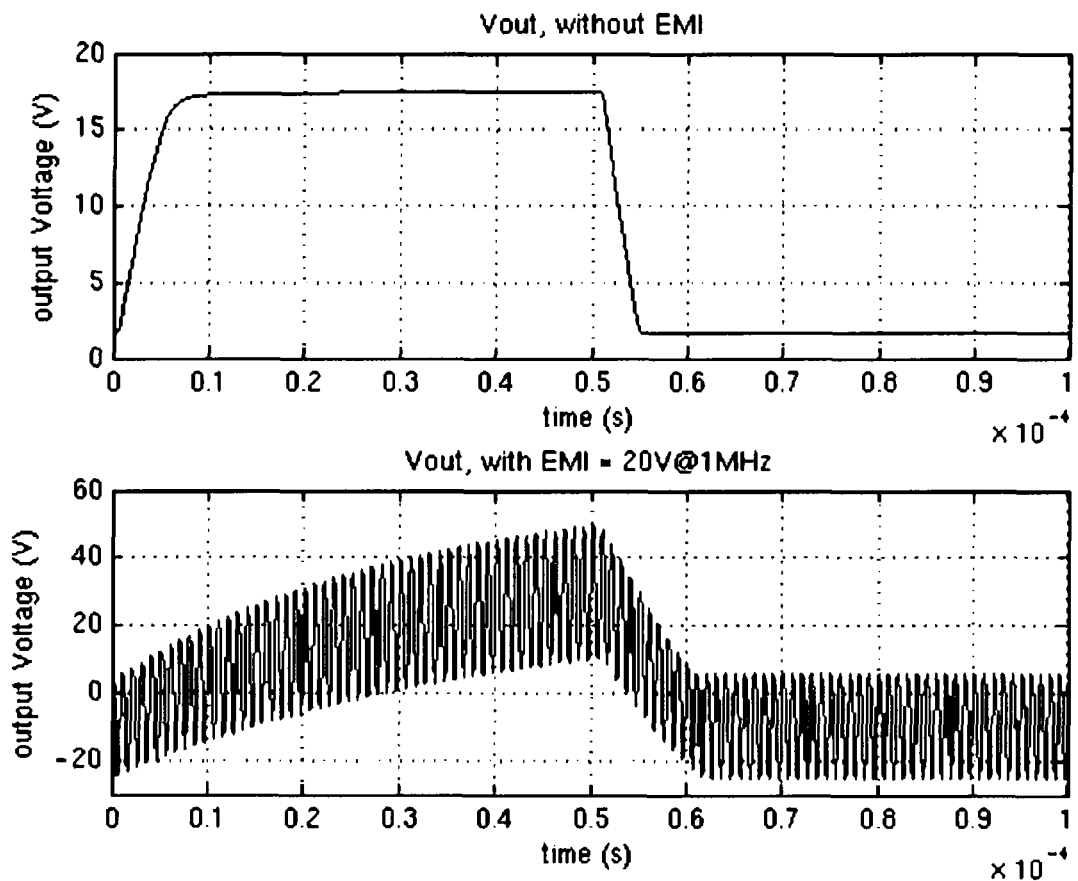
FIG. 2 shows a graph of distortion of the output signal due to injected EMI.

By way of introduction to the embodiments, a problem with the operation of the LIN driver of FIG. 1(a) will be explained. When EMI is present at the output of the circuit (modelled by the presence of voltage source Vemi, which is coupled into the system through the bus capacitance Cb), it will reach the gate of transistor Mo through capacitance Cf (as shown by the dotted line in FIG. 1(b) for a certain range of frequencies. This can cause a DC shift on the gate of output transistor Mo, which will completely distort the wanted slope. FIG. 2 shows a graph of distortion of the output signal due to injected EMI. It is not possible to retrieve the original duty cycle from such a corrupted signal. The effect of EMI induced DC shift is also called charge pumping, and is described by J.-M. Redouté and M. Steyaert, in "Current mirror structure insensitive to conducted EMI", Electronics Letters, October 2005, Vol. 41 No. 21. It can be concluded that the topology of FIG. 1(a) will not work if sufficient interference present on its output is allowed to reach the gate of the output transistor.

One feature of embodiments of the present invention is to split the slope control function from the output stage, while correcting and adjusting load and power source, e.g. battery, voltage variations by means of feedback. By providing an output circuit having circuitry arranged to reduce an amount of conducted EMI induced DC shift in the output circuit, this topology for the driver can help to reduce sensitivity to EMI, as the slope control function is shielded from the noisy bus. This can be applied to any driver not just those for LIN buses.

Optional additional features of the embodiments, as described below include the following: the output circuit having an amplifier with a feedback path, the feedback path having a clipping circuit arranged to provide a clipped version of the signal on the output line as feedback to the amplifier, to reduce an amount of the conducted EMI in the feedback to the amplifier. The clipping can be referenced to the slope controlled version of the input signal fed to the amplifier. A buffer circuit can be provided to couple the output to the clipping circuit. The output circuit can have an amplifier such as an op-amp circuit and an output transistor. The amplifier, e.g. op-amp, can have an output stage having a local negative feedback circuit arranged to reduce charge pumping. The driver circuit can be arranged to be suitable for driving a LIN network.

For the application as a LIN driver, the arrangement can be designed to comply with the worst case "direct power injection" (DPI) measurements (e.g. for a zone 1 appliance) while delivering an output signal whose duty cycle stays almost unaltered. The DPI measurement requires that a forward power of maximally 5 W must be injected into the system to be tested through a coupling capacitance, and this for frequencies ranging from 150 kHz to 1 GHz. More details of how to make such measurements can be found in IEC 62132-4, Ed. 1: ICs, Measurement of E/M immunity 150 kHz to 1GHz—Part 4: Direct RF power injection method.

Figure 3:
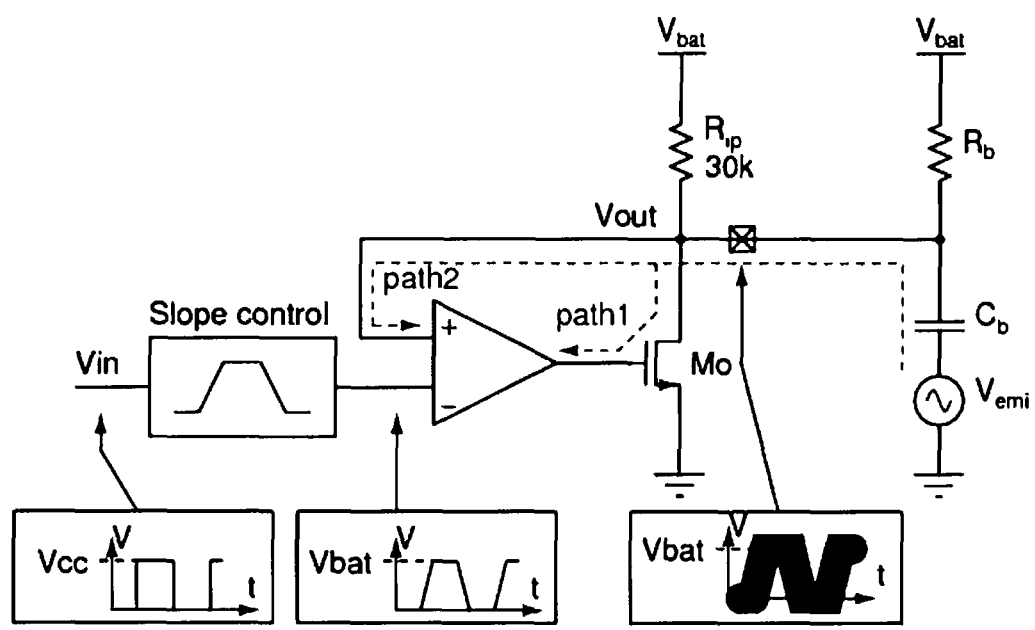
FIG. 3 shows a schematic of an embodiment of a modified LIN driver according to the invention.

FIG. 3 shows a schematic view of a first embodiment of the invention. Similar reference signs are used as in FIG. 1(a) and FIG. 1(b), as appropriate. The input is coupled to a slope control part. An example of how to implement this part is described below with reference to FIG. 6, though many other implementations can be envisaged. The slope control part outputs a slope controlled signal to the output stage for coupling onto the bus.

The diodes or other circuits preventing the EMI source discharging into the supply and the ground have been omitted so as not to clutter unnecessarily the schematic. Resistor Rip represents the internal pull up resistance (30 kg), while Rb represents the total pull up resistance seen at the output of the circuit.

However, there are two new paths through which EMI is injected into the circuit. The next two sections will deal with each EMI path, and derive how the EMI disturbance can be thwarted from reaching and interfering with the sensitive nodes of the circuit.

Solving EMI Path 1

Figure 4:
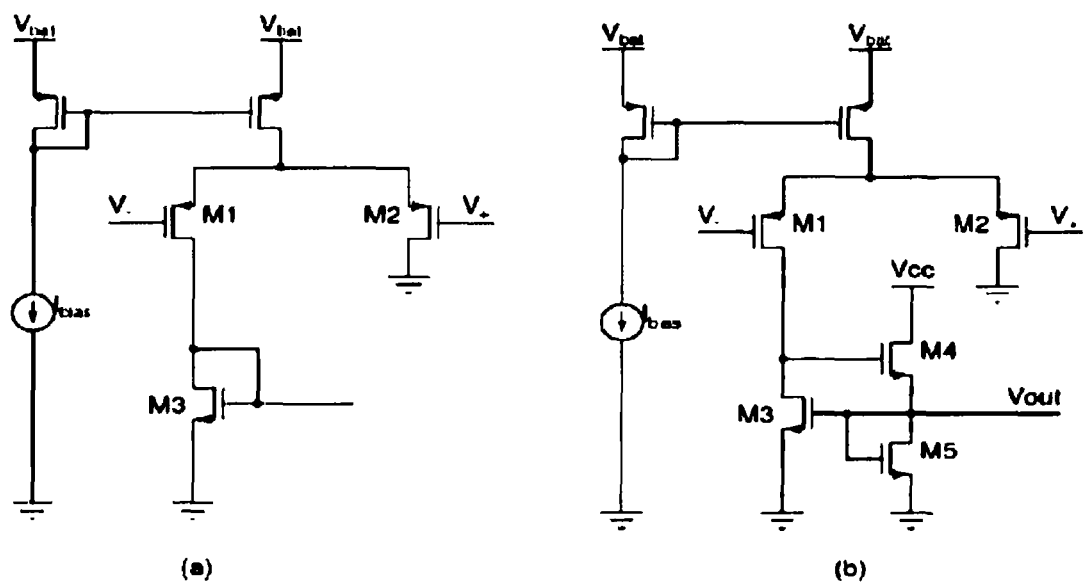
FIG. 4(a) shows a schematic of a basic rail-to-rail op-amp with a low output impedance.
FIG. 4(b) shows a schematic of an improved op-amp with a high degree of resistance against charge pumping on its output node according to an embodiment.

The parasitic drain gate capacitance will cause the EMI disturbance to couple to the gate of transistor Mo, (which can be any type of transistor, such as MOSFET, CMOS, Bipolar and so on) starting from a certain frequency, hereby triggering charge pumping. This charge pumping can be strongly reduced by arranging the output of the amplifier, e.g. op-amp, to have a low impedance. For example, a rudimentary op-amp structure with a low output impedance is depicted in FIG. 4(a). This structure can have the property of having a very low gain, but this is desirable, as will be explained in the next section. However, for large interference levels and for higher frequencies, charge pumping can still be an issue. An improved op-amp structure according to an embodiment is shown in FIG. 4(b) which uses negative feedback to keep the sensitive gate of transistor Mo under control, and thereby prevents charge pumping from happening on this node. Here, charge pumping is countered by the local negative feedback composed of transistors M4 and M5 regulating this node. Nevertheless, the finite transconductances of transistors M4 and M5 lead to a small residual charge pumping: this charge pumping term however is much smaller than the one obtained previously and simulations confirm that this effect is too small to be harmful.

the amplifier, e.g. op-amp. But the smaller Av(op-amp) is made, the smaller the total signal loop gain, and consequently the larger the steady state error ($\epsilon$) becomes: indeed, the signal loop gain is equal to the op-amp open loop gain times the gain of the common source output stage composed of transistor Mo. Since the dominant pole of the system is set by the bus time constant, which—according to the LIN specification from the LIN consortium, LINspec package revision 2.0 http//www.lin-subbus.org. September 2003, (available online) for example—can vary, for example, between 1 microsec and 5 microsec, depending on the total load of the bus, the open loop gain of the op-amp as well as the gain of common source output stage can be approximated as a constant value over frequency, as long as the frequency stays below the pole determined by the bus time constant. Knowing the wanted signal loop gain, the needed op-amp open loop gain is easily found after making a sound approximation based on simulations of the average value of the gain of the common source output stage.

Transistor Mo has no fixed operating point because it is working as a switch: it is therefore useful to estimate its average small signal gain. This is realized by performing small signal AC analyses for different intermediate bias conditions. This is of course a rough and rather inaccurate approximation method. It does however serve the purpose to prove that the op-amp gain does not have to be large at all. Indeed, simulations confirm that, using an NDMOS output switch (Mo) of 125 micron×32 fingers (it is a transistor of a considerable size because it must be able to sink 40 mA with a minimal drain to source voltage drop) and evaluating both load conditions (ZL=1 kΩ/1 nF and 500Ω/10 nF), the following average small signal gains are obtained:

$$\begin{cases} V_{bat} = 18\text{ V} \rightarrow \overline{A_{v\_DC\_max}(\text{switch})} \approx 40 \text{ dB} \\ V_{bat} = 8\text{ V} \rightarrow \overline{A_{v\_DC\_min}(\text{switch})} \approx 34 \text{ dB} \end{cases}$$

Accounting for a maximal steady state error of 0.5V, the following values for the wanted signal open loop gain are obtained (for both extreme values of the supply voltage):

$$\begin{cases} \varepsilon_{min} = \dfrac{0.5\text{ V}}{18\text{ V}} = 2.8\% \Rightarrow |T_{signal(s)\_DC\_min}| = 31 \text{ dB} \\ \varepsilon_{max} = \dfrac{0.5\text{ V}}{8\text{ V}} = 6.3\% \Rightarrow |T_{signal(s)\_DC\_max}| = 24 \text{ dB} \end{cases}$$

Using (4) and (5), the corresponding op-amp DC open loop gain can be computed:

$$\begin{cases} |T_{signal(s)\_min}| = 31 \text{ dB and } \overline{A_{v\_DC}(\text{switch})} \approx 40 \text{ dB} \rightarrow A_{v\_DC}(opamp) \approx -9 \text{ dB} \\ |T_{signal(s)\_max}| = 24 \text{ dB and } \overline{A_{v\_DC}(\text{switch})} \approx 34 \text{ dB} \rightarrow A_{v\_DC}(opamp) \approx -10 \text{ dB} \end{cases}$$

Solving EMI Path 2

Solving the second EMI path is more intricate. Since the non-inverting input of the amplifier, e.g. op-amp, is connected to the output node, an EMI disturbance that is present on the output, will be amplified by the op-amp, and will appear at the gate of transistor Mo hereby completely distorting the wanted signal that is present there. This EMI contribution is however directly proportional to the open loop gain (Av(op-amp)) of The previous expressions show that in order to guarantee a maximal static DC error of 0.5V, the minimal op-amp open loop DC gain must be equal to −9 dB. Knowing that the "useful" signal at the non-inverting pin of the op-amp differs maximally by 0.5V from the signal that is present at the inverting pin of the op-amp, then using an op-amp with a DC gain of −9 dB, leads to the notable conclusion that the signal reaching the non inverting input of the op-amp can be drastically clipped between these same levels without any loss of signal information. The feedback signal can be buffered first, before clipping, for example by making a high impedance copy of the signal on LIN bus.

Figure 5:
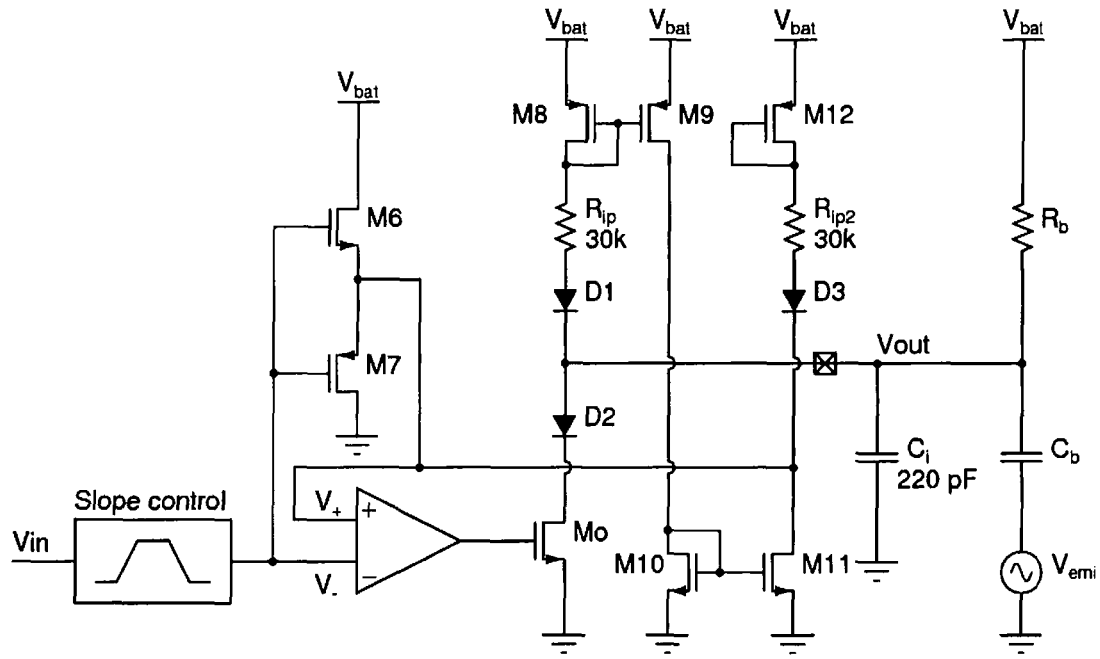
FIG. 5 shows an overall schematic of an embodiment of an EMI resisting LIN driver.

An overall schematic of a driver circuit according to an embodiment of the invention is shown in FIG. 5. Corresponding reference signs to those of earlier figures have been used as appropriate.

Diodes D1 and D2 (or other suitable elements or circuits) prevent interferences from coupling into the supply voltage (during a positive swing) and into the ground (during a negative swing). Capacitor Ci represents the small decoupling capacitance of 220 pF according to the above mentioned LIN specification. A high impedance copy of the signal on the LIN bus is made by means of two current mirrors formed by transistors (M8, M9, M10, M11). A clipping circuit in the form of transistors M6 and M7 ensure that the signal on V+ never exceeds the input signal on V− with more than Vt. This is shown by coupling the gates of transistors M6 and M7 to the slope controlled signal input to the op-amp, though other implementations can be envisaged. Since the EMI present on the output is first copied, then heavily reduced by transistors M6 and M7, and further attenuated by 9 dB through the op-amp before reaching the gate of transistor Mo, a high immunity against EMI is realized that way. In this figure the output circuit is represented by the op-amp, output transistor Mo, feedback buffer in the form of mirror circuit comprising transistors M8, M9, M10, M11, M12, and clipping circuit comprising transistors M6, M7. Transistor M12 together with diode D3 and resistor $R_{ip2}$ load the drain of transistor M11 in the same way that transistor M8 together with diode D1 and resistor $R_{ip1}$ load the drain of transistor Mo.

The Slope Control Stage

Figure 6:
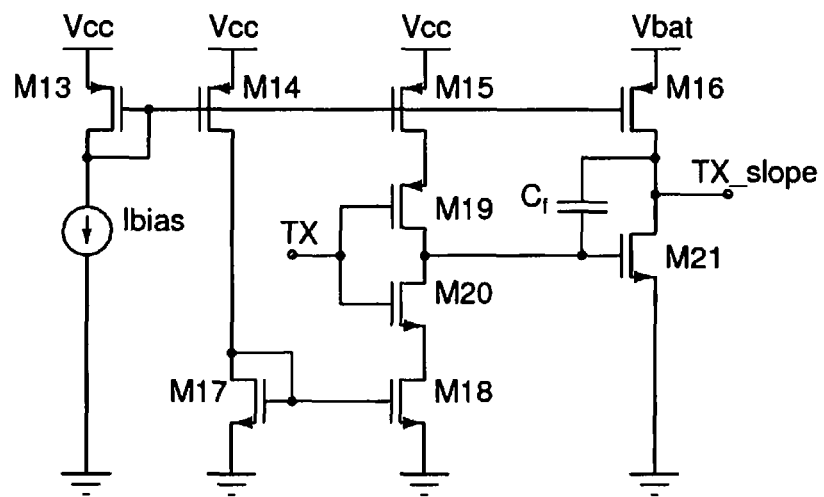
FIG. 6 shows a slope control circuit.

The circuit generating the slope is not disturbed by EMI anymore, and an example implementation uses a current starved inverter directing a constant current through a capacitor $C_f$, as shown in FIG. 6 though other implementations can be envisaged. FIG. 6 shows a mirror circuit having transistors M13, M14, M15, M17, M18, and transistors M19, M20, coupled to a TX input, and transistors M16 and M21, coupled to a TX_slope output, and arranged to operate as follows. Current source Ibias is scaled and copied so that transistors M15 and M18 are both biased as current sources delivering an equal current. M15 sources the current while M18 sinks it. The TX input signal switches the inverter M19-M20 ON and OFF. If TX is HIGH, M19 is off so M15 can not source current. But M20 is on, and so is M18, which sinks a constant current and hereby discharges the capacitor with this constant current until the gate of M21 has dropped to zero (or very close to zero). Similarly, if TX is LOW, M20 is off and so M18 can not sink current. But M19 is on, and so is M15, which sources a constant current and hereby charges the capacitor with this constant current until the gate of M21 has reached Vbat (or almost Vbat). The operation is equal to the circuit described in FIG. 1, but since the circuit is not connected to the LIN bus, current source M16 has been added to ensure the biasing of M21. The current source Ibias can be made to change according to Vbat, e.g. by using a resistor, connected to the battery voltage, followed by a current mirror.

Figure 7:
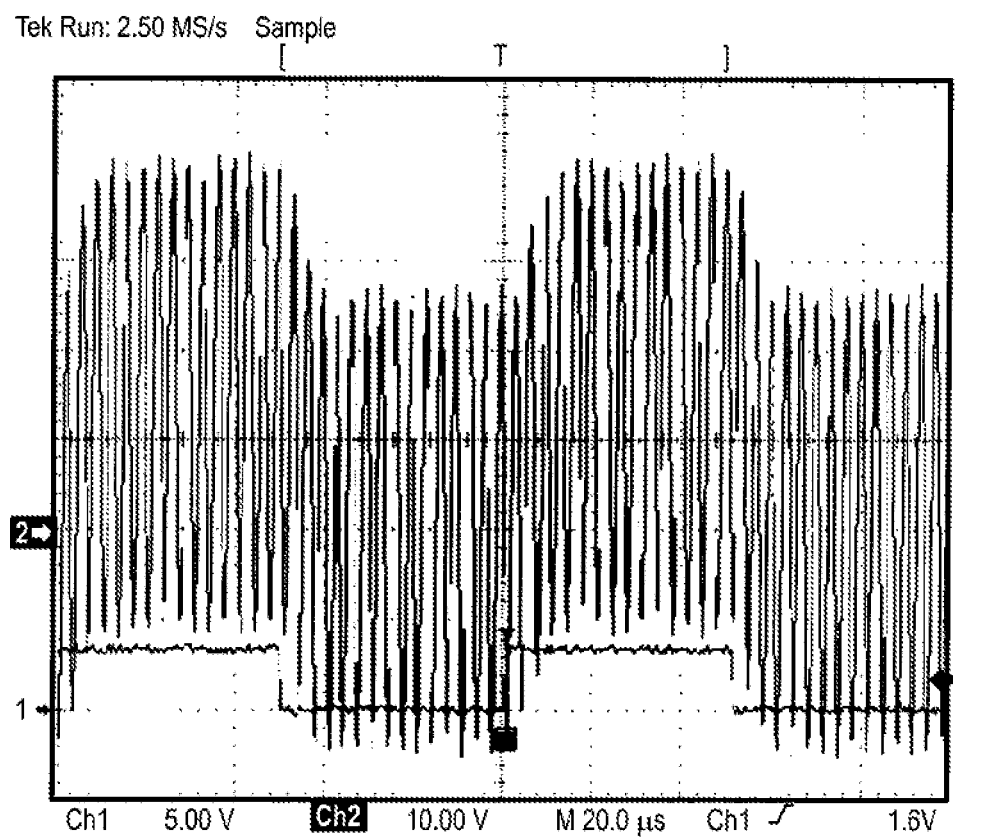
FIG. 7 shows a graph of an example of an EMI distorted LIN output signal, which is generated by an EMI insensitive LIN driver. Although heavily corrupted, the resulting signal after numerical filtering possesses the same duty cycle as the transmitted signal (at the bottom).

FIG. 7, Test Measurements

The LIN driver that was presented in FIG. 5 has been integrated using the AMIS I3T80 high voltage technology. Because of the intricate nature of the EMI DPI measurements, precautions were taken to ensure that the interference reaches the LIN driver output for all frequencies: for this reason, the die was mounted on a thick film ceramic substrate along with the external pull up resistor and the bus capacitance through which the EMI disturbance is injected. Starting from 150 kHz, the interference was injected through the bus capacitance into the circuit while the output signal was continuously monitored on an oscilloscope. An example of a resulting output signal is shown in FIG. 7. This shows a graph of an example of an EMI distorted LIN signal. Although heavily corrupted, the resulting signal after numerical filtering possesses the same duty cycle as the transmitted signal (at the bottom).

| Tau = 5 us | | | Tau = 1 us | | |
|---|---|---|---|---|---|
| Frequency (MHz) | Forward Power (W) | Duty cycle (%) | Frequency (MHz) | Forward Power (W) | Duty cycle (%) |
| 0.15 | 5 | 45.6 | 0.15 | 5 | 45.2 |
| 1.1 | 5 | 43.2 | 1.1 | 5 | 42.8 |
| 5.3 | 5 | 46.8 | 5.3 | 5 | 45.6 |
| 40.3 | 5.5 | 48.4 | 40.3 | 5.2 | 49.6 |
| 100.3 | 5 | 48.4 | 100.3 | 5 | 49.2 |
| 300.3 | 5.1 | 49.2 | 300.3 | 5.2 | 50 |

Table 1. Measurement results. The duty cycle was between 50% levels of the battery voltage of the Matlab filtered waveform.

The worst case DPI criterion (zone 1 appliance) was applied, i.e. that a forward power of maximally 5 W must be injected into the system to be tested through a coupling capacitance, and this for frequencies ranging from 150 kHz to 1 GHz. The obtained waveforms were filtered and processed numerically in order to measure the duty cycle. A listing of the performed measurements, and the measured duty cycle for each level and frequency of EMI interference is shown in Table 1.

The largest measured duty cycle deviation of this filtered waveform is equal to 7.2%, which lies within the range that is specified by the above mentioned LIN specification, namely the duty cycle should be between 41.7% and 59% at a transmission speed of 10.4 kbit/s, and between 39.6% and 58.1% at a transmission speed of 20 kbit/s.

An integrable LIN driver structure has been presented above with reference to the figures, which can offer a high degree of immunity against conducted EMI. Embodiments of this circuit can produce a duty cycle that is well within the accepted specifications and this under the highest levels of interference which are described in the DPI specification. As has been described, a driver circuit suitable for outputting a signal onto an output line which can have conducted EMI, has a slope control circuit and an output circuit, (e.g. an amplifier or op-amp, transistors Mo, M13 to M21). It can be used for driving a LIN network. The slope control circuit (e.g. transistors M13 to M21) outputs a slope controlled version of the input signal to the output circuit, which is arranged to reduce an amount of conducted EMI induced DC shift in the output circuit. This can involve clipping a feedback signal (e.g. transistors M6, M7), and regulating an output stage of the op-amp to prevent the DC shift. Having a separate output circuit can help shield the slope control circuit from the EMI on the output line. Although described in relation to examples using a LIN networks, it is clearly applicable also to other types of network which have different slope requirements, or to those having no specified slope limits. Other variations and additions can be envisaged by those skilled in the art within the scope of the claims.

The invention claimed is:

1. A driver circuit suitable for outputting a signal onto a line affected by conducted EMI, the driver circuit comprising:
    a slope control circuit receiving an input signal and outputting a slope controlled version of the input signal;
    an operational amplifier, having two inputs and an output, the output of the slope control circuit being connected to a first one of said inputs of the operational amplifier; and
    an output transistor, receiving at its input the output of the operational amplifier-whereby the output transistor is arranged to output the slope controlled version to the line;
    whereby the second input of the operational amplifier is connected over a feedback path with the output of the output transistor
    whereby the output signal of the slope control circuit and the output of the operational amplifier are signals having a rising edge and a falling edge, both edges being slope controlled and
    whereby the feedback path contains a clipping circuit for reducing an amount of the conducted EMI in the feedback to the amplifier.

2. The driver circuit of claim 1, the clipping circuit comprising two transistors of different polarity, both transistors being connected between the feedback path and the supply voltage, the gates of both transistors being coupled to said first input of the operational amplifier.

3. The driver circuit of claim 2 and having a buffer circuit, the input of the buffer circuit being coupled to the line and the output of the buffer circuit being coupled to the second input of the operational amplifier.

4. The driver circuit of claim 1, the operational amplifier comprising an output stage having an internal negative feedback circuit arranged to reduce the EMI induced DC level shift.

5. The driver circuit of claim 1 and arranged to be suitable for driving a LIN network.

6. A system for generating the input signal, and having one or more driver circuits, each of the one or more driver circuits being suitable for outputting a signal onto a line affected by conducted EMI, each of the one or more driver circuits comprising:
    a slope control circuit receiving an input signal and outputting a slope controlled version of the input signal;
    an operational amplifier, having two inputs and an output, the output of the slope control circuit being connected to a first one of said inputs of the operational amplifier; and
    an output transistor, receiving at its input the output of the operational amplifier-whereby the output transistor is arranged to output the slope controlled version to the line;
    whereby the second input of the operational amplifier is connected over a feedback path with the output of the output transistor,
    whereby the output signal of the slope control circuit and the output of the operational amplifier are signals having a rising edge and a falling edge, both edges being slope controlled and
    whereby the feedback path contains a clipping circuit for reducing an amount of the conducted EMI in the feedback to the amplifier.

7. A network having a line, and two or more systems coupled to a line affected by conducted EMI, each of the systems comprising one or more driver circuits, each driver circuit of each system being suitable for outputting a signal onto the line, each of the one or more driver circuits comprising:
    a slope control circuit receiving an input signal and outputting a slope controlled version of the input signal;
    an operational amplifier, having two inputs and an output, the output of the slope control circuit being connected to a first one of said inputs of the operational amplifier; and
    an output transistor, receiving at its input the output of the operational amplifier-whereby the output transistor is arranged to output the slope controlled version to the line;
    whereby the second input of the operational amplifier is connected over a feedback path with the output of the output transistor,
    whereby the output signal of the slope control circuit and the output of the operational amplifier are signals having a rising edge and a falling edge, both edges being slope controlled and
    whereby the feedback path contains a clipping circuit for reducing an amount of the conducted EMI in the feedback to the amplifier.

8. A method of using a driver circuit to drive a line according to an input signal, the line being affected by conducted EMI, and having the steps of:
    controlling transitions of the input signal to a predetermined slope in a slope control circuit;
    amplifying the signal having controlled transitions in an operational amplifier;
    sending the amplified signal having controlled transitions to an output stage for driving the line;
    feeding back the driving signal, delivered by the output stage to an input of the operational amplifier;
    clipping the feedback signal in order to reduce an amount of the conducted EMI in the feedback to the amplifier
    whereby the signal having controlled transitions has a slope controlled rising edge and a slope controlled falling edge so that the effect of the conducted EMI from the line on the slope output is limited.

* * * * *